(12) United States Patent
Glazer et al.

(10) Patent No.: US 12,721,108 B2
(45) Date of Patent: Aug. 25, 2026

(54) VIOS MODULATOR SENSITIVITY FOR MICRO LED BACKPLANE ARRAY ELECTRICAL TEST

(71) Applicant: Orbotech Ltd., Yavne (IL)

(72) Inventors: Arie Glazer, Mevaseret Zion (IL); Victor Rybalkin, Beer-Sheva (IL); Tali Hurvits, Ramat HaSharon (IL)

(73) Assignee: Orbotech Ltd., Yavne (IL)

( * ) Notice: Subject to any disclaimer, the term of this patent is extended or adjusted under 35 U.S.C. 154(b) by 407 days.

(21) Appl. No.: 18/338,838

(22) Filed: Jun. 21, 2023

(65) Prior Publication Data

US 2024/0429106 A1 Dec. 26, 2024

(51) Int. Cl.
*H10P 74/20* (2026.01)
*G01R 31/26* (2020.01)
*H10D 86/01* (2026.01)

(52) U.S. Cl.
CPC ........ *H10P 74/203* (2026.01); *G01R 31/2635* (2013.01); *H10D 86/021* (2025.01)

(58) Field of Classification Search
CPC ..................................................... H10P 74/203
See application file for complete search history.

(56) References Cited

U.S. PATENT DOCUMENTS 5,465,052 A * 11/1995 Henley ............... G06F 11/2221 324/760.02
7,639,319 B2 12/2009 Chen
2008/0239208 A1* 10/2008 Chen ..................... G02F 1/1334 349/86

* cited by examiner

*Primary Examiner* — Bo B Jang
(74) *Attorney, Agent, or Firm* — Hodgson Russ LLP

(57) ABSTRACT

The Voltage Image Optical System (VIOS) includes a substrate, an electro-optic modulator, a light source, a detector, and a processor. The electro-optic modulator is separated from the substrate by a buffer material and includes a mirrored pellicle, a transparent electrode, and a polymer dispersed liquid crystal (PDLC) sensor material disposed between the transparent electrode and the mirrored pellicle. The buffer material is disposed between the mirrored pellicle and the substrate. The light source is configured to illuminate the PDLC sensor material during application of a voltage to the transparent electrode, and the detector is configured to detect intensity of light reflected by the mirrored pellicle. The processor is configured to determine whether a pixel electrode on the substrate is a defective pixel electrode or a functioning pixel electrode based on the intensity of the light transmitted by the PDLC and reflected by the mirrored pellicle.

9 Claims, 8 Drawing Sheets

VIOS MODULATOR SENSITIVITY FOR MICRO LED BACKPLANE ARRAY ELECTRICAL TEST

FIELD OF THE DISCLOSURE

This disclosure relates to manufacturing micro LED displays and, more particularly, to testing micro LEDs during their manufacturing process.

BACKGROUND OF THE DISCLOSURE

Active-matrix (AM) displays are based on electronically modulated light by optoelectronic means such as liquid crystal (LC) or OLED. The displays consist of a pixel array, where each pixel is made of a thin film transistor (TFT) circuit and an electrode. The TFT circuit may drive the electrode to emit light. The display image is obtained by altering the voltage across the pixel's optoelectronic structure, so that the light intensity of each pixel is modulated. The functionality of each TFT circuit is electrically tested before the LC or OLED materials are added to avoid detective pixels in the display. TFT array testers include a Voltage Image Optical System (VIOS), which is a non-contact technique for detecting defects in the TFT pixel array substrate. According to this measurement technique, the performance of an array is simulated as if it were assembled into a TFT cell and then the characteristics of a TFT array are measured by indirectly measuring actual voltage distribution on the panel, or so-called voltage imaging, using an electro-optical (EO) light modulator-based detector. Defective pixels can be identified by abnormalities in their optical response.

A voltage imaging system in its most basic form includes an electro-optical (EO) modulator, an imaging objective lens, a charge coupled device (CCD) camera or other appropriate or similar sensor, and an image processor. The electro-optic sensor of the EO modulator is based on the light scattering characteristics of nematic liquid crystal droplets in a polymer matrix (polymer dispersed liquid crystal, or PDLC) film. In operation, the EO modulator is placed approximately 5-30 microns above the surface of a TFT array, and a voltage bias is applied across a transparent electrode of a layer of indium tin oxide (ITO) on a surface of the EO modulator. Thereupon, the EO modulator capacitively couples to the TFT array so that an electric field associated with the TFT array is sensed by the PDLC layer. Intensity of incident light transmitted through the PDLC layer is varied (i.e., is modulated) by any variations in the electric field strength across the LC material in the PDLC. This light is then reflected off a dielectric mirror and collected by the CCD camera or like sensor. A source of incident radiation, which may be for example infrared or visible light, is provided to illuminate the sandwich of TFT array, PDLC film and dielectric mirror.

In some instances, an air gap of 30 to 50 μm between the modulator and the TFT array for pixel electrodes greater than 20 μm by 60 μm may be required to accommodate variations in the flatness of the glass substrate and to reduce the electrostatic force between the modulator and the panel. However, VIOS sensitivity decreases as the air gap increases and pixel electrode size decreases. In order to compensate for increased air gaps and smaller pixel sizes (e.g., micro LEDs), improvements have been generally directed to improving the sensor material of the modulator itself.

Therefore, what is needed is method to improve VIOS modulator sensitivity of micro LEDs for electrical testing.

BRIEF SUMMARY OF THE DISCLOSURE

An embodiment of the present disclosure provides a system. The system may comprise a support, an electro-optic modulator, a light source, a detector, and a processor. A substrate may be disposed on the support. The electro-optic modulator may be separated from the substrate by a buffer material. The electro-optic modulator may comprise a mirrored pellicle, a transparent electrode, and a polymer dispersed liquid crystal (PDLC) sensor material. The mirrored pellicle may be disposed proximate to the support, the buffer material may be disposed between the mirrored pellicle and the substrate, the transparent electrode may be distal from the support, and the PDLC sensor material may be disposed between the transparent electrode and the mirrored pellicle. The light source may be configured to illuminate the PDLC sensor material during application of a voltage to the transparent electrode, and the detector may be configured to detect intensity of light reflected by the mirrored pellicle. The processor may be configured to determine whether a pixel electrode on the substrate is a defective pixel electrode or a functioning pixel electrode based on the intensity of the light transmitted by the PDLC sensor material and reflected by the mirrored pellicle.

In some embodiments, there may be no air gap between the electro-optic modulator and the substrate.

In some embodiments, the buffer material may comprise a plastic foil disposed on the mirrored pellicle. The plastic foil may have a thickness of 1 μm to 20 μm. The plastic foil may comprise $BaTiO_3$/poly(methyl methacrylate) or poly (methyl methacrylate)+$LiClO_4$+ (polyethylene glycol).

In some embodiments, the light source may be configured to illuminate the PDLC sensor material during application of the voltage to the transparent electrode after a photoresist coating is stripped from the substrate.

In some embodiments, the buffer material may comprise a photoresist coating on the substrate. The photoresist coating may have a thickness of 2 μm to 5 μm.

In some embodiments, the substrate may comprise a glass plate including a pixel array, and each pixel of the pixel array comprises a thin film transistor circuit and an electrode.

In some embodiments, the processor may be further configured to compare the intensity of the light corresponding to each pixel electrode to a preset calibration range. The pixel electrode may be determined to be a defective pixel when the gray level intensity is outside of the preset calibration range, and the pixel electrode may be determined to be a functioning pixel when the gray level intensity is within the preset calibration range.

Another embodiment of the present disclosure provides a method. The method may comprise: disposing an electro-optical modulator on a substrate, wherein the electro-optical modulator is separated from the substrate by a buffer material and comprises a polymer dispersed liquid crystal (PDLC) sensor material disposed between a transparent electrode and a mirrored pellicle; applying a voltage to the transparent electrode while illuminating the PDLC sensor material; detecting an intensity of light transmitted by the PDLC sensor material and reflected by the mirrored pellicle; and determining whether a pixel electrode on the substrate is a defective pixel electrode or a functioning pixel electrode based on the intensity of the light transmitted by the PDLC sensor material and reflected by the mirrored pellicle.

In some embodiments, the method may further comprise: depositing an indium tin oxide (ITO) layer on the substrate; depositing a photoresist coating on the ITO layer; etching the ITO layer to form a pixel electrode on the substrate; and stripping the photoresist coating from the pixel electrode.

In some embodiments, the photoresist coating may be stripped from the pixel electrode before disposing the electro-optical modulator on the substrate, and the buffer material may comprise a plastic foil disposed on the mirrored pellicle. The plastic foil may have a thickness of 1 μm to 20 μm. The plastic foil may comprise $BaTiO_3$/poly(methyl methacrylate) or poly(methyl methacrylate)+$LiClO_4$+polyethylene glycol.

In some embodiments, the photoresist coating may be stripped from the pixel electrode after detecting the changed intensity of the light transmitted by the PDLC sensor material, and the buffer material may comprise the photoresist coating on the ITO layer. The photoresist coating may have a thickness of 2 μm to 5 μm In some embodiments, determining whether the pixel electrode is a defective pixel electrode or a functioning pixel electrode based on the intensity of the light transmitted by the PDLC sensor material and reflected by the mirrored pellicle may comprise: comparing the intensity of the light corresponding to a pixel electrode to a preset calibration range. The pixel electrode may be determined to be a defective pixel when the gray level intensity is outside of the preset calibration range, and the pixel electrode may be determined to be a functioning pixel when the gray level intensity is within the preset calibration range.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Figure 1:
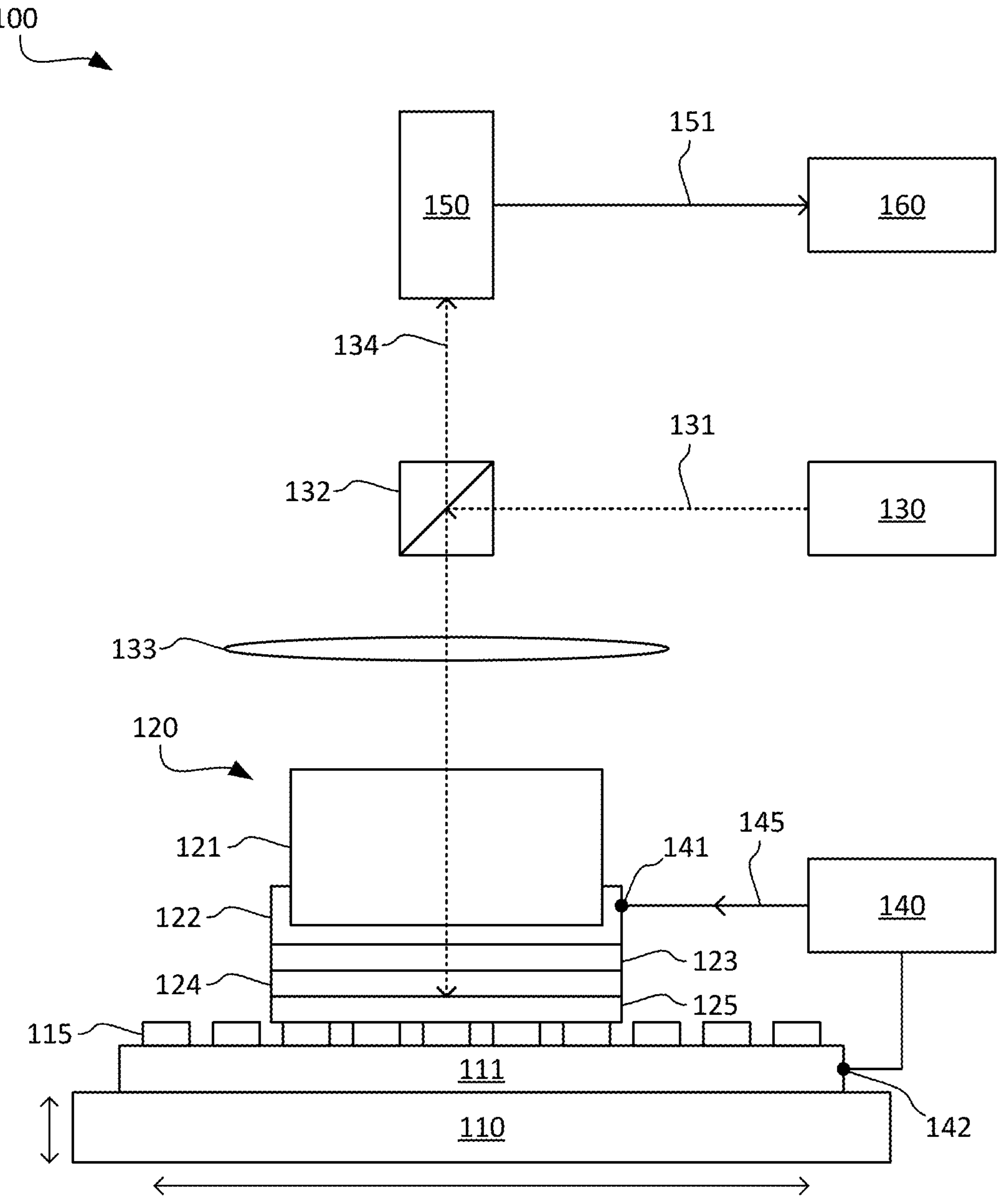
FIG. 1 is a cross-sectional side view of a system according to an embodiment of the present disclosure.

Although claimed subject matter will be described in terms of certain embodiments, other embodiments, including embodiments that do not provide all of the benefits and features set forth herein, are also within the scope of this disclosure. Various structural, logical, process, step, and electronic changes may be made without departing from the scope of the disclosure. Accordingly, the scope of the disclosure is defined only by reference to the appended claims.

An embodiment of the present disclosure provides a system 100. The system 100 may be a Voltage Imaging Optical System (VIOS) shown in FIG. 1. The system 100 may comprise a support 110. The support 110 may be a stage having at least two degrees of freedom. For example, the support 110 may be configured to move in two in-plane directions (e.g., x-y directions). The support 110 may be further configured to rotate and/or move in an out-of-plane direction (e.g., z direction). The support 110 may be movable by one or more actuators or other means and is not limited herein. Alternatively, other components of the system 100 may move relative to the support 110. A substrate 111 may be disposed on the support 110. The substrate 111 may be a glass panel or a silicon wafer comprising a pixel array (shown in FIG. 2), where each pixel 115 comprises a thin film transistor (TFT) circuit and an electrode. Substrate glass or silicon wafers usually vary from 8 to 12 inches in diameter. The TFT circuit may drive the electrode to emit light. The electrode of each pixel 115 may vary from single $\mu m^2$ to tens of $\mu m^2$ (e.g., 2×2 $\mu m^2$ to 2×6 $\mu m^2$). Accordingly, each pixel 115 may correspond to a micro LED for a micro LED display.

The system 100 may further comprise an electro-optical (EO) modulator 120. The EO modulator 120 may be positioned above the support 110, and may cover at least a portion of the pixel array of the substrate 111 for testing the respective TFT circuits of each pixel 115 covered by the EO modulator 120. The EO modulator 120 may comprise an optical glass 121, a transparent electrode 122, a polymer dispersed liquid crystal (PDLC) sensor material 123, and a mirrored pellicle 124. The transparent electrode 122 may be disposed on the optical glass 121 on a surface facing the support 110. The optical glass 121 may be a block of optical quartz or type BK-7 optical glass having optically flat upper and lower surfaces. The transparent electrode 122 may further extend onto side surfaces of the optical glass 121. The transparent electrode 122 may comprise an indium tin oxide (ITO) coating or other conductive coatings. The PDLC sensor material 123 may be disposed on the transparent electrode 122. The PDLC sensor material 123 may exhibit an electro-optical response to an applied electrical field, e.g., applied to the transparent electrode 122. The mirrored pellicle 124 may be disposed on the PDLC sensor material 123, proximal to the support 110. The optical glass 121, transparent electrode 122, PDLC sensor material 123, and mirrored pellicle 124 may be bonded together by adhesives.

The system 100 may further comprise a light source 130. The light source 130 may be configured to illuminate the PDLC sensor material 123 of the EO modulator 120. For example, the light source 130 may be configured to emit light along an optical path 131, and one or more optical elements may be configured to direct the optical path 131 to illuminate the PDLC sensor material 123. The optical elements may include a beam splitter 132 and an objective lens 133 positioned in the optical path 131. The light may be directed through the optical glass 121 and the transparent electrode 122 to illuminate the PDLC sensor material 123. The light may then be reflected by the mirrored pellicle 124 along a reflected path 134. The light may be within the visible light spectrum. For example, the light may have a wavelength from 380 to 700 nm.

The system 100 may further comprise a voltage source 140. The voltage source 140 may be configured to apply a voltage 145 to the transparent electrode 122 of the EO modulator 120. For example, the voltage source 140 may comprise a first electrode 141 connected to the transparent electrode 122, and a second electrode 142 connected to the substrate 111. In some embodiments, the second electrode 142 may be connected directly or indirectly to a pixel 115 of the pixel array with varying voltage. The first electrode 141 may be connected to the transparent electrode 122 on a side surface of the optical glass 121. The second electrode 142 may be grounded. When voltage 145 is applied to the transparent electrode 122, the electric field generated between the EO modulator 120 and the substrate 111 may depend on each pixel's optoelectronic structure, and the electric field may modulate light intensity transmitted by the PDLC sensor material 123. A transmission-voltage (T-V) curve can be obtained based on the applied voltage 145 and the transmitted light in the reflected path 134. The voltage 145 may be in a range of tens to hundreds of volts.

The light source 130 and the voltage source 140 may be configured to simultaneously illuminate the PDLC sensor material 123 and apply voltage 145 to the transparent electrode 122 of the EO modulator 120.

The system 100 may further include a detector 150. The detector 150 may be positioned in the reflected path 134, and may be configured to detect an intensity of the light reflected by the mirrored pellicle 124. The detected light intensity of each pixel 115 covered by the EO modulator 120 may be represented in an image 151 captured by the detector 150. For example, the detector 150 may be a charge coupled device (CCD) camera or other image sensor. For testing of TFTs, if a constant voltage near the middle of the T-V curve (i.e., near the inflection point) is applied on the EO modulator 120, the voltage applied on each pixel 115 can be detected by the detector 150 as a change in light intensity. Therefore, a defective pixel can be detected by virtue of abnormality of its optical response.

Figure 3A:
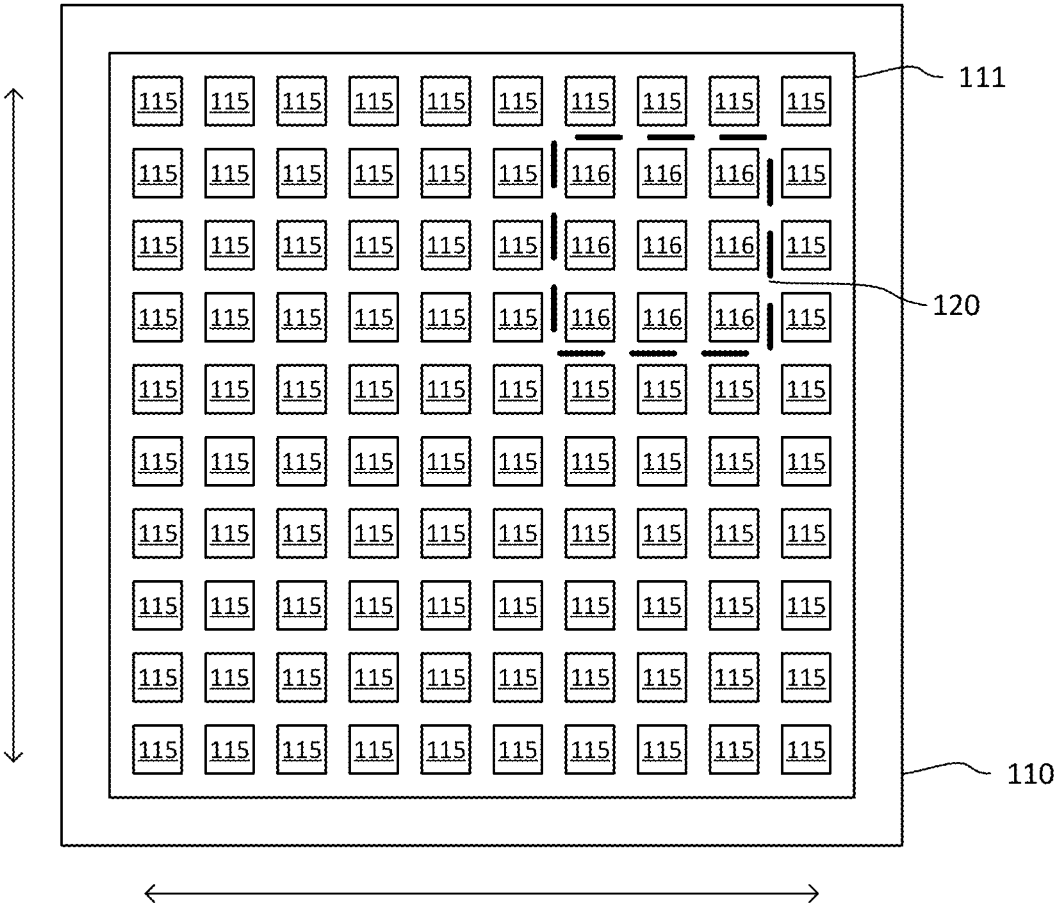
FIG. 3A is a top view of a substrate according to an embodiment of the present disclosure, where the electro-optical modulator is disposed on a first set of pixels of the substrate.
Figure 3B:
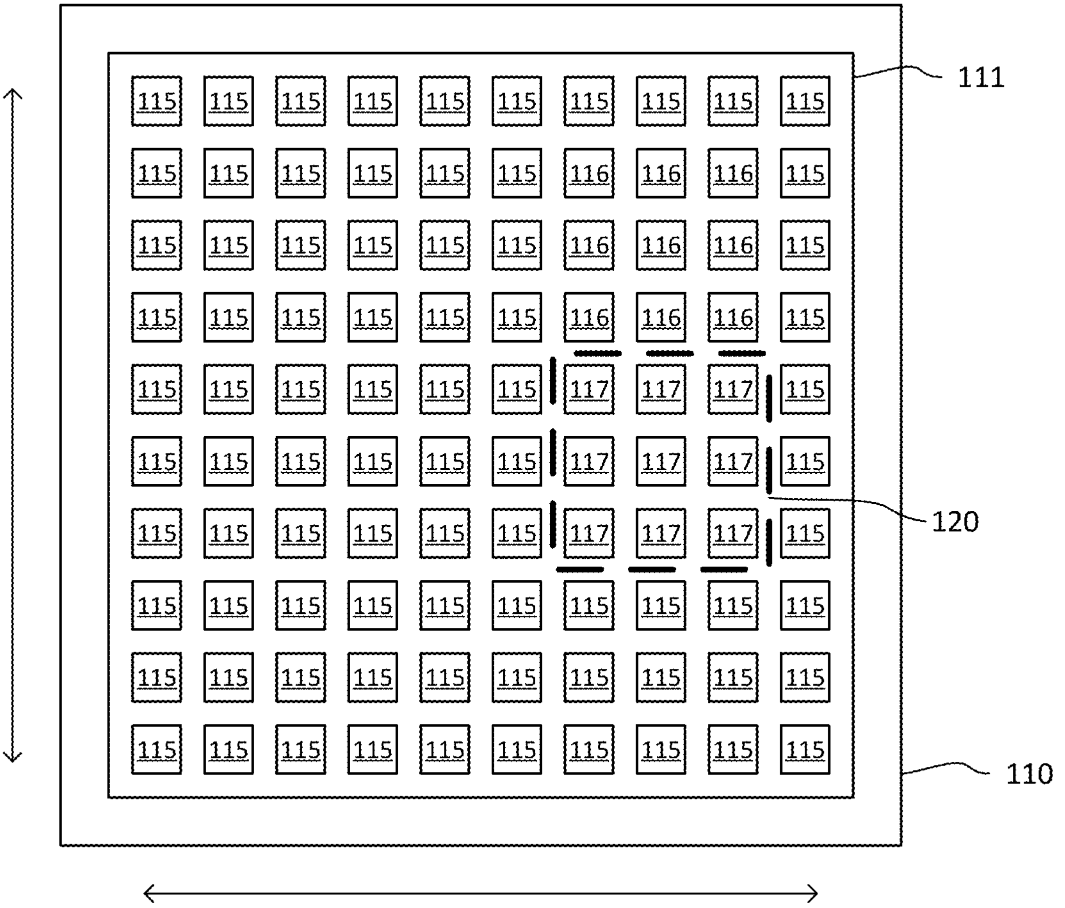
FIG. 3B is a top view of a substrate according to an embodiment of the present disclosure, where the electro-optical modulator is disposed on a second set of pixels of the substrate, after the support is moved from the position shown in FIG. 3A.

When the support 110 moves relative to the EO modulator 120 and the detector 150, the EO modulator 120 may be disposed on different pixels 115 of the substrate 111, which defines the pixels 115 captured by the detector 150. For example, the detector 150 may capture an image of a first set of pixels 116 covered by the EO modulator 120 (as shown in FIG. 3A), based on the size of the EO modulator 120, and by moving the support 110, the detector 150 may capture an image of a second set of pixels 117 covered by the EO modulator 120 (as shown in FIG. 3B). The pixels 115 within the first set of pixels 116 and the second set of pixels 117 may be mutually exclusive or may overlap, and may depend on the size of the EO modulator 120. For example, stitching may be used where the EO modulator 120 is smaller than the substrate 111 (i.e., more than one image is needed to capture each pixel 115 of the array of pixels on the substrate 111). By capturing images of the first set of pixels 116, the second set of pixels 17, and any number of additional sets of pixels, images of each pixel 115 of the array of pixels on the substrate 111 may be captured by the detector 150.

The system 100 may further comprise a processor 160. The processor 160 may include a microprocessor, a microcontroller, or other devices.

The processor 160 may be coupled to the components of the system 100 in any suitable manner (e.g., via one or more transmission media, which may include wired and/or wireless transmission media) such that the processor 160 can receive output. The processor 160 may be configured to perform a number of functions using the output. A wafer inspection tool can receive instructions or other information from the processor 160. The processor 160 optionally may be in electronic communication with another wafer inspection tool, a wafer metrology tool, or a wafer review tool (not illustrated) to receive additional information or send instructions.

The processor 160 may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 160 may be disposed in or otherwise part of the system 100 or another device. In an example, the processor 160 and may be part of a standalone control unit or in a centralized quality control unit. Multiple processors 160 may be used, defining multiple subsystems of the system 100.

The processor 160 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 160 to implement various methods and functions may be stored in readable storage media, such as a memory.

If the system 100 includes more than one subsystem, then the different processors 160 may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 160 may be configured to perform a number of functions using the output of the system 100 or other output. For instance, the processor 160 may be configured to send the output to an electronic data storage unit or another storage medium. The processor 160 may be further configured as described herein.

The processor 160 may be configured according to any of the embodiments described herein. The processor 160 also may be configured to perform other functions or additional steps using the output of the system 100 or using images or data from other sources.

The processor 160 may be communicatively coupled to any of the various components or sub-systems of system 100 in any manner known in the art. Moreover, the processor 160 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 160 and other subsystems of the system 100 or systems external to system 100. Various steps, functions, and/or operations of system 100 and the methods disclosed herein are carried out by one or more of the following: electronic circuits, logic gates, multiplexers, programmable logic devices, ASICs, analog or digital controls/ switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 160 (or computer subsystem) or, alternatively, multiple processors 160 (or multiple computer subsystems). Moreover, different sub-systems of the system 100 may include one or more computing or logic systems. Therefore, the above description should not be interpreted as a limitation on the present disclosure but merely an illustration.

The processor 160 may be in electronic communication with the detector 150. For example, the processor 160 may receive the image 151 by wired or wireless transmission. The processor 160 may be configured to determine whether a pixel electrode on the substrate 111 is a defective pixel electrode or a functioning pixel electrode based on the intensity of the light transmitted by the PDLC sensor material 123 and reflected by the mirrored pellicle 124 based on the image 151 received by the detector 150. For example, the processor 160 may compare the intensity of the light corresponding to each pixel electrode to a preset calibration range. The intensity of the light may correspond to a gray level intensity of the corresponding pixel in the image 151, and the preset calibration range may be a range of gray level intensity values corresponding to functioning pixel electrodes (e.g., based on previous measurements). The pixel electrode may be determined to be a defective pixel electrode when the gray level intensity is outside of the preset calibration range, and the pixel electrode may be determined to be a functioning pixel electrode when the gray level intensity is within the preset calibration range. Other methods of analyzing the image 151 to determine whether each pixel electrode is a defective pixel or a functioning pixel are possible and is not limited herein.

Based on the structure of the system 100 described above, sensitivity of the EO modulator 120 is directly proportional to the slope of the T-V curve, and is related to: the size distribution of liquid crystal droplets in the PDLC sensor material 123; the interface properties between the polymer matrix and the liquid crystal; and the size of an air gap between the EO modulator 120 and the substrate 111. EO modulator sensitivity decreases as the air gap increases. Accordingly, the embodiments of the present disclosure may increase modulator sensitivity by decreasing or eliminating the air gap by incorporating a buffer material between the EO modulator 120 and the substrate 111.

Figure 2:
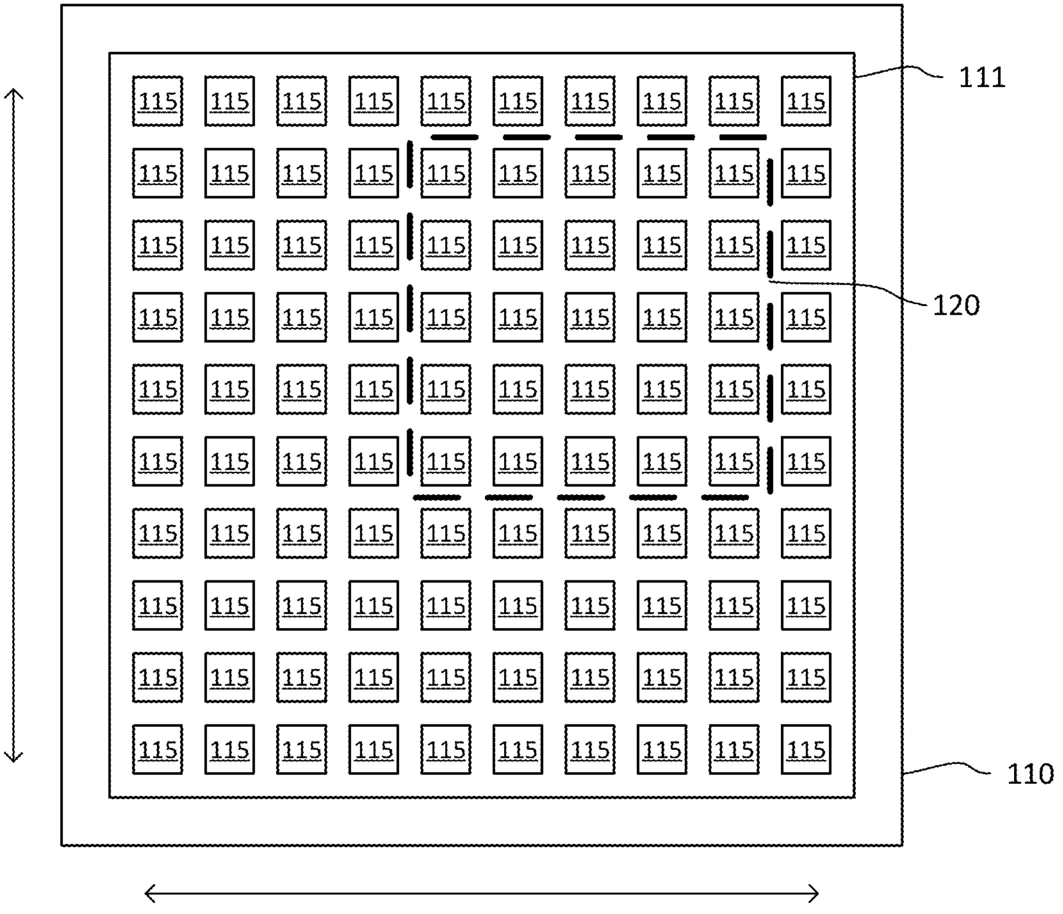
FIG. 2 is a top view of a substrate according to an embodiment of the present disclosure, where the electro-optical modulator is disposed on a portion of the substrate.

In some embodiments, the buffer material may comprise a plastic foil 125 disposed on the mirrored pellicle 124, as shown in FIG. 1. For example, the plastic foil 125 may be bonded to the mirrored pellicle 124 by an adhesive, and may thereby be an integrated part of the EO modulator 120. The plastic foil 125 may have a thickness of 1 μm to 20 μm. The plastic foil 125 may comprise a material having a high discharge voltage and a high dielectric constant. For example, the plastic foil 125 may comprise $BaTiO_3$/poly (methyl methacrylate) or poly(methyl methacrylate)+$LiClO_4$+polyethylene glycol (e.g., 10 wt %) or other materials that can reach dielectric constants of at least 4. In some embodiments, the plastic foil 125 may have a dielectric constant greater than 25. Accordingly, the plastic foil 125 may be disposed directly on the substrate 111, such that there is no air gap between the EO modulator 120 and the substrate 111. The plastic foil 125 may further protect the substrate 111 from damage due to contact with the EO modulator 120. The plastic foil 125 may be removable from the mirrored pellicle 124 in order to be replaced when the plastic foil 125 becomes dirty or worn. The frequency of replacing the plastic foil 125 may depend on the cleanliness of the environment.

The EO modulator 120 having the plastic foil 125 may be used to test the TFT circuits of the substrate 111 following or during the process of manufacturing the pixel electrodes on the substrate 111. For example, the process may comprise: (a) silicon nitride (SiNx) passivation; (b) lithography and SiNx etch to open ITO contact hole and the display I/O contacts; (c) photoresist stripping; (d) ITO by PVD disposition; (e) lithography definition of the pixel electrode and ITO etch; and (f) photoresist stripping. In some embodiments, the testing may be performed after step (f) photoresist stripping. For example, the light source 130 may be configured to illuminate the PDLC sensor material 123 and the voltage source 140 may apply the voltage to the transparent electrode 122 after a photoresist coating is stripped from the substrate 111. In other words, the ITO electrode surfaces on the substrate 111 are bare, and the plastic foil 125 may be disposed directly on the substrate 111 to perform testing.

Figure 4:
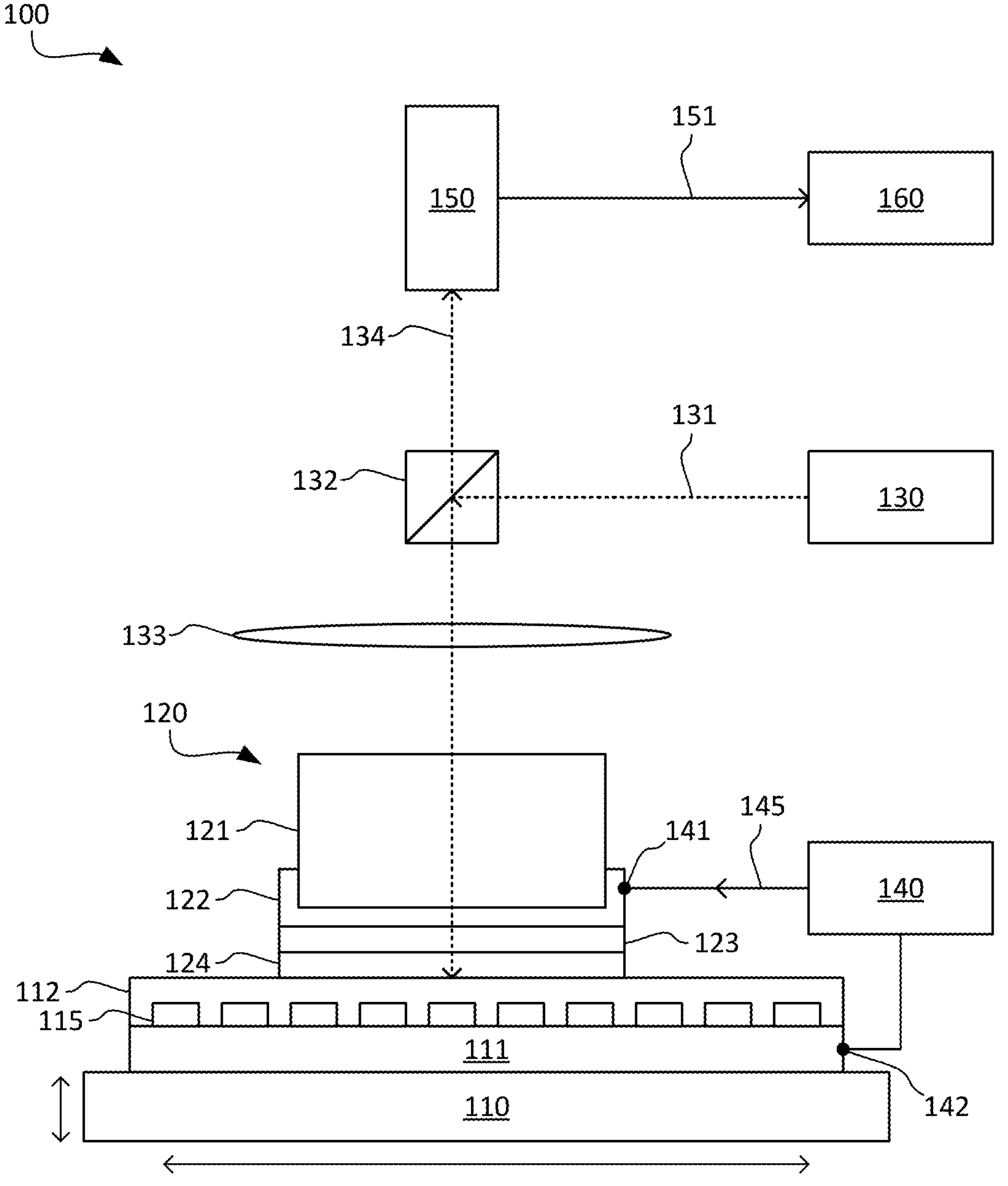
FIG. 4 is a cross-sectional side view of a system according to another embodiment of the present disclosure.

In some embodiments, the buffer material may comprise a photoresist coating 112 on the substrate 111, as shown in FIG. 4. In other words, the testing may be performed before step (f) of photoresist stripping. The photoresist coating 112 may have a thickness of 2 μm to 5 μm, and may have a dielectric constant of about 4. During testing, the mirrored pellicle 124 of the EO modulator 120 may be disposed directly on the photoresist coating 112, which may protect the ITO electrode surfaces from damage from the EO modulator 120 during testing. The mirrored pellicle 124 may have anti-stick properties to avoid build-up of photoresist on the EO modulator 120 after repeated contact with the photoresist coating 112 for each measurement.

With the system 100, VIOS sensitivity may be increased by decreasing or eliminating the air gap between the substrate 111 and the EO modulator 120 during testing. The addition of a plastic foil 125 on the mirrored pellicle 124 or the reliance on the photoresist coating 112 remaining on the substrate 111 may protect the ITO electrode surfaces during testing, without modifying the PDLC sensor material 123 itself.

Figure 5:
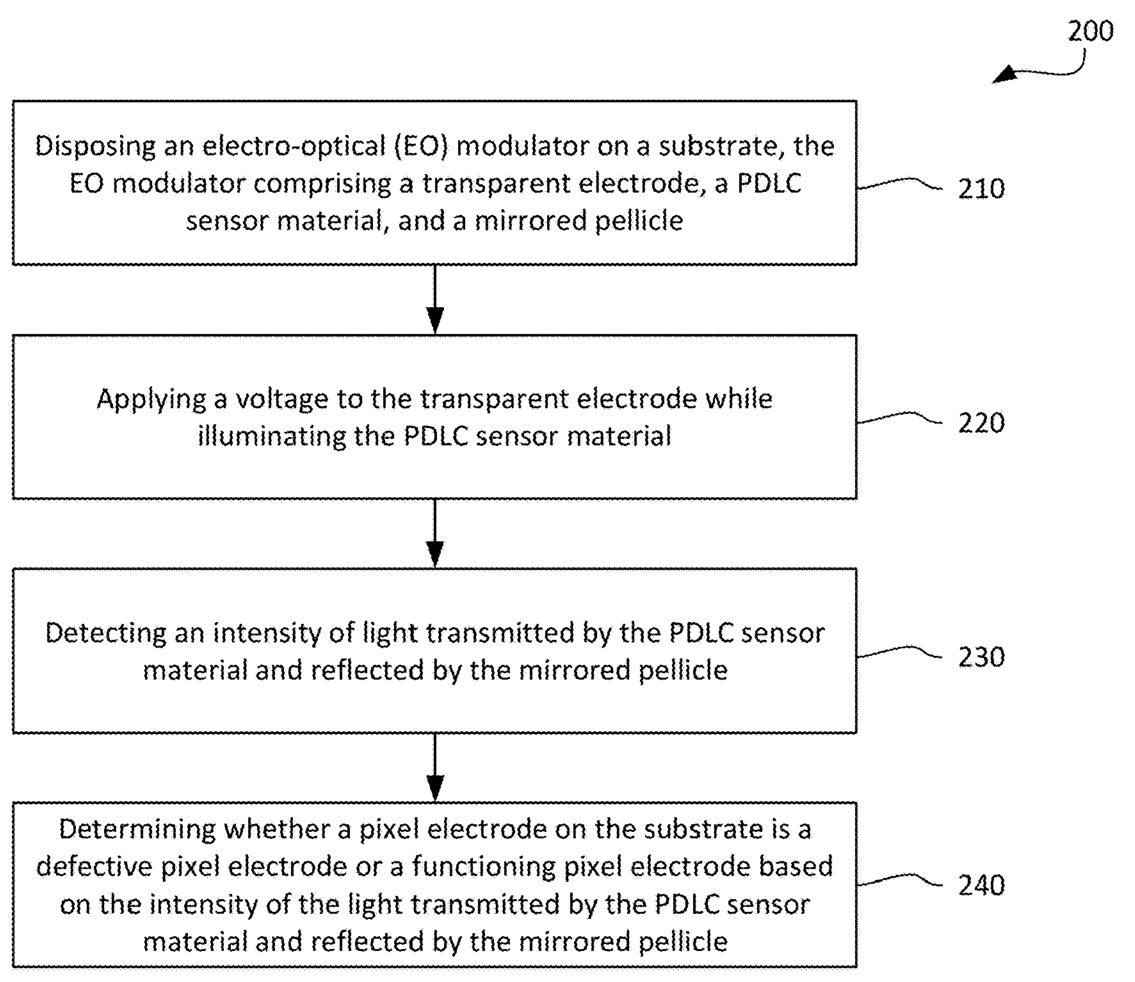
FIG. 5 is a flow chart of a method according to an embodiment of the present disclosure.

Another embodiment of the present disclosure provides a method 200. With reference to FIG. 5, the method 200 may comprise the following steps.

At step 210, an electro-optical (EO) modulator is disposed on a substrate. The substrate may be a glass panel or a silicon wafer comprising a pixel array, where each pixel comprises a thin film transistor (TFT) circuit and an electrode. The electrode of each pixel may be single $\mu m^2$ to tens of $\mu m^2$ (e.g., 2×2 $\mu m^2$ to 2×6 $\mu m^2$). Accordingly, each pixel may correspond to a micro LED for a micro LED display. The substrate may be disposed on a support. The support may be a stage having at least two degrees of freedom. For example, the support may be configured to move in two in-plane directions (e.g., x-y directions). The support may be further configured to rotate and/or move in an out-of-plane direction (e.g., z direction). The support may be movable by one or more actuators or other means and is not limited herein. Alternatively, other components may move relative to the support.

The EO modulator may cover at least a portion of the pixel array of the substrate for testing the respective TFT circuits of each pixel covered by the EO modulator. The EO modulator may comprise an optical glass, a transparent electrode, a polymer dispersed liquid crystal (PDLC) sensor material, and a mirrored pellicle. The transparent electrode may be disposed on the optical glass on a surface facing the support. The optical glass may be a block of optical quartz or type BK-7 optical glass having optically flat upper and lower surfaces. The transparent electrode may further extend onto side surfaces of the optical glass. The transparent electrode may comprise an indium tin oxide (ITO) coating or other conductive coatings. The PDLC sensor material may be disposed on the transparent electrode. The PDLC sensor material may exhibit an electro-optical response to an applied electrical field, e.g., applied to the transparent electrode. The mirrored pellicle may be disposed on the PDLC sensor material, proximal to the support. The optical glass, transparent electrode, PDLC sensor material, and mirrored pellicle may be bonded together by adhesives. The EO modulator may be separated from the substrate by a buffer material. Accordingly, there may be no air gap between the EO modulator and the substrate.

At step 220, a voltage is applied to the transparent electrode while the PDLC is illuminated. A voltage source may be configured to apply the voltage to the transparent electrode of the EO modulator. For example, the voltage source may comprise a first electrode connected to the transparent electrode, and a second electrode connected to the substrate. The first electrode may be connected to the transparent electrode on a side surface of the optical glass. The second electrode may be grounded. When voltage is applied to the transparent electrode, the electric field generated between the EO modulator and the substrate may depend on each pixels optoelectronic structure, and the electric field may modulate light intensity transmitted by the PDLC sensor material. A transmission-voltage (T-V) curve can be obtained based on the applied voltage and the transmitted light.

A light source may be configured to illuminate the PDLC sensor material of the EO modulator. For example, the light source may be configured to emit light along an optical path, and one or more optical elements may be configured to direct the optical path to illuminate the PDLC sensor material. The optical elements may include a beam splitter and an objective lens positioned in the optical path. The light may be directed through the optical glass and the transparent electrode to illuminate the PDLC sensor material. The light may then be reflected by the mirrored pellicle along a reflected path.

The light source and the voltage source may be configured to simultaneously illuminate the PDLC sensor material and apply voltage to the transparent electrode of the EO modulator.

At step 230, an intensity of light transmitted by the PDLC sensor material and reflected by the mirrored pellicle is detected. A detector may be positioned in the reflected path, and may be configured to detect the intensity of the light reflected by the mirrored pellicle. The detected light intensity of each pixel covered by the EO modulator may be represented in an image output by the detector. For example, the detector may be a charge coupled device (CCD) camera or other image sensor. For testing of TFTs, if a constant voltage near the middle of the T-V curve is applied on the EO modulator, the voltage applied on each pixel can be detected by the detector as a change in light intensity. Therefore, a defective pixel can be detected by virtue of abnormality of its optical response.

At step 240, a pixel electrode on the substrate is determined to be a defective pixel electrode or a functioning pixel electrode based on the intensity of the light transmitted by the PDLC sensor material and reflected by the mirrored pellicle. A processor may be in electronic communication with the detector. For example, the processor may receive the image by wired or wireless transmission. The processor may be configured to determine whether a pixel electrode on the substrate is a defective pixel electrode or a functioning pixel electrode based on the intensity of the light transmitted by the PDLC sensor material and reflected by the mirrored pellicle based on the image received by the detector. For example, the processor may compare the intensity of the light corresponding to each pixel electrode to a preset calibration range. The intensity of the light may correspond to a gray level intensity of the corresponding pixel in the image, and the preset calibration range may be a range of gray level intensity values corresponding to a functioning pixel electrode (e.g., based on previous measurements). The pixel electrode may be determined to be a defective pixel electrode when the gray level intensity is outside of the preset calibration range, and the pixel electrode may be determined to be a functioning pixel electrode when the gray level intensity is within the preset calibration range. Other method of analyzing the image to determine whether each pixel electrode is a defective pixel electrode or a functioning pixel electrode are possible and is not limited herein.

Based on the method 200 described above, sensitivity of the EO modulator is directly proportional to the slope of the T-V curve, and is related to: the size distribution of liquid crystal droplets in the PDLC sensor material; the interface properties between the polymer matrix and the liquid crystal; and the size of an air gap between the EO modulator and the substrate. EO modulator sensitivity decreases as the air gap increases. Accordingly, the embodiments of the present disclosure may increase modulator sensitivity by decreasing or eliminating the air gap by incorporating the buffer material between the EO modulator and the substrate.

Figure 6:
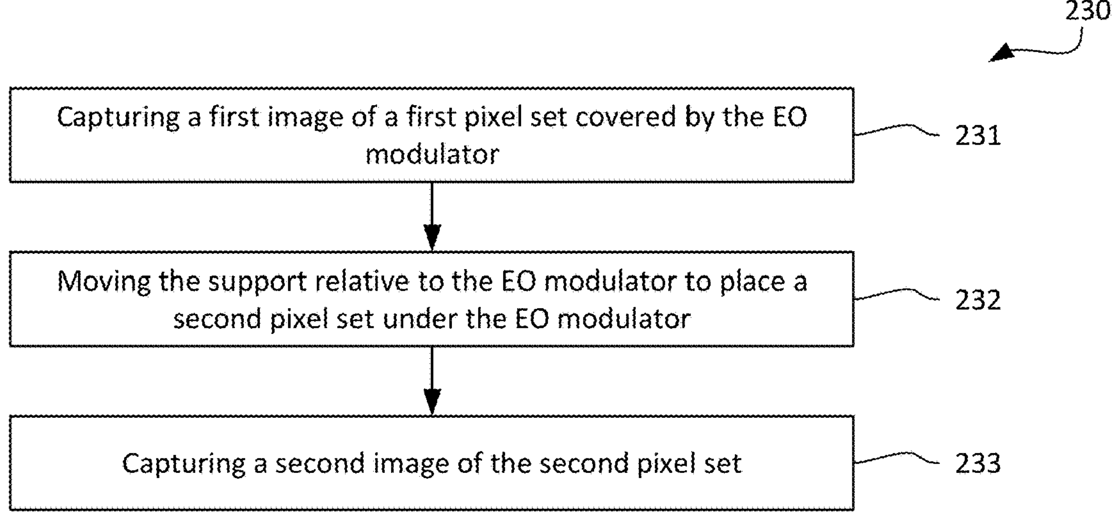
FIG. 6 is a flow chart of the steps of detecting the intensity of the light transmitted by the PDLC sensor material and reflected by the mirrored pellicle.

In some embodiments, the support may be moved such that the EO modulator is disposed on different pixels of the substrate. Accordingly, detecting an intensity of light transmitted by the PDLC sensor material and reflected by the mirrored pellicle at step 230 may comprise the following steps shown in FIG. 6.

At step 231, a first image is captured of a first pixel set covered by the EO modulator.

At step 232, the support is moved relative to the EO modulator to place a second pixel set under the EO modulator. The second pixel set may contain at least some pixels not present in the first pixel set.

At step 233, a second image of the second pixel set is captured with the detector.

Step 232 and step 233 may be repeated any number of times to place further sets of pixels covered by the EO modulator and capture images of each pixel on the substrate. The processor may track x-y location data of the support to identify the locations of each pixel in each image. Each image may be received by the processor, which can determine whether each pixel electrode in the respective image is a defective pixel electrode or a functioning pixel electrode in step 240 described above.

In some embodiments, the buffer material may comprise a plastic foil disposed on the mirrored pellicle. For example, the plastic foil may be bonded to the mirrored pellicle by an adhesive, and may thereby be an integrated part of the EO modulator. The plastic foil may have a thickness of 1 μm to 20 μm. The plastic foil may comprise $BaTiO_3$/poly(methyl methacrylate) or poly(methyl methacrylate)+$LiClO_4$+polyethylene glycol (e.g., 10 wt %) or other materials that can reach dielectric constants greater than 25. Accordingly, the plastic foil may be disposed directly on the substrate, such that there is no air gap between the EO modulator and the substrate. The plastic foil may further protect the substrate from damage due to contact with the EO modulator. The plastic foil may be removable from the mirrored pellicle in order to be replaced when the plastic foil becomes dirty or worn.

Figure 7A:
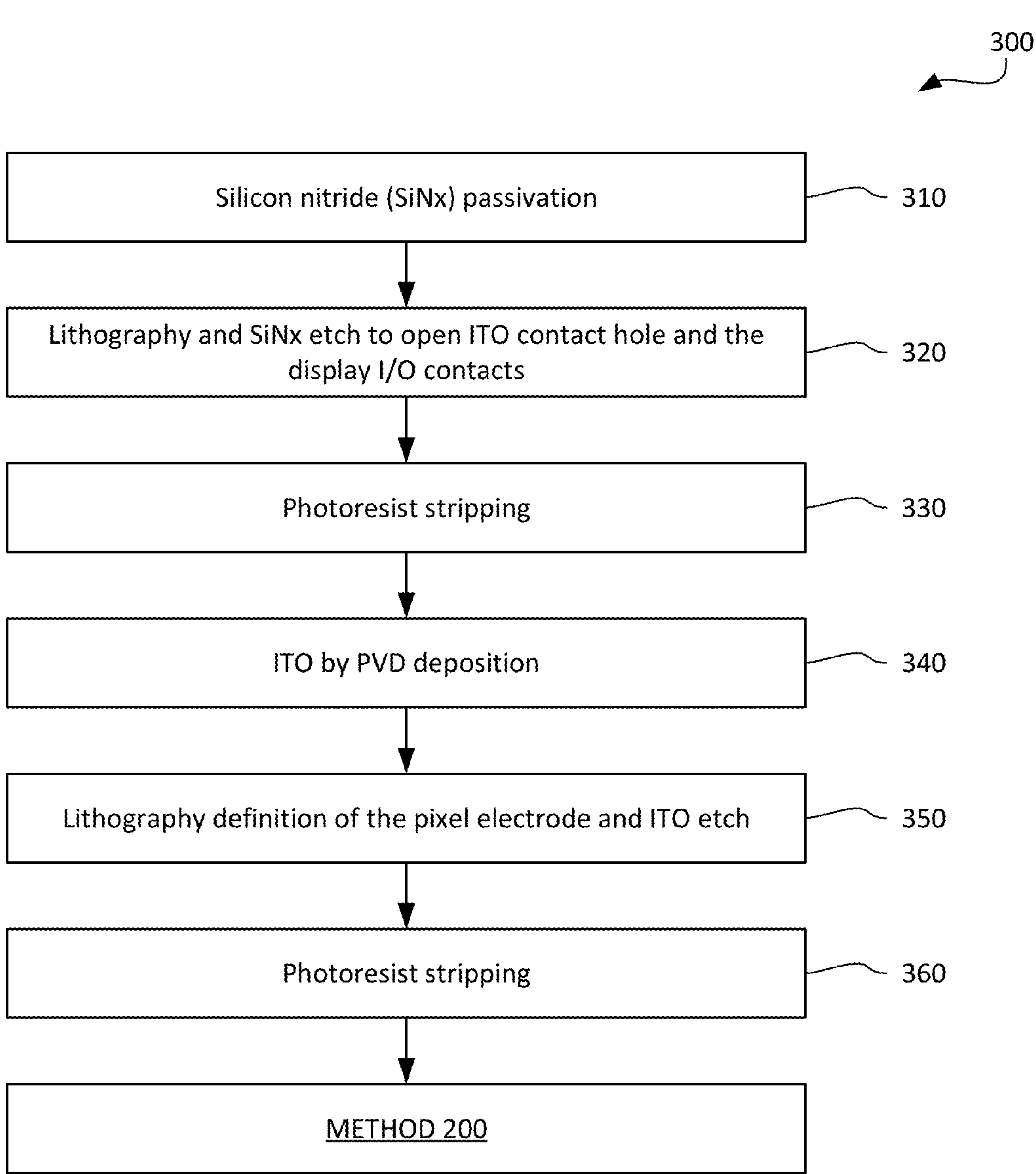
FIG. 7A is a flow chart of a process of manufacturing the pixel electrodes on the substrate, where the method of FIG. 5 is performed after the process.

The EO modulator having the plastic foil may be used to test the TFT circuits of the substrate following or during the process 300 of manufacturing the pixel electrodes on the substrate. For example, the process 300 (shown in FIG. 7A and FIG. 7B) may comprise: step 310, silicon nitride (SiNx) passivation; step 320, lithography and SiNx etch to open ITO contact hole and the display I/O contacts; step 330, photoresist stripping; step 340, ITO by PVD disposition; step 350, lithography definition of the pixel electrode and ITO etch; and step 360, photoresist stripping. In some embodiments, the method 200 may be performed after step 360 of photoresist stripping in the process 300, as shown in FIG. 7A. For example, the light source may be configured to illuminate the PDLC material and the voltage source may apply the voltage to the transparent electrode after a photoresist coating is stripped from the substrate. In other words, the ITO electrode surfaces on the substrate are bare, and the plastic foil may be disposed directly on the substrate to perform testing.

Figure 7B:
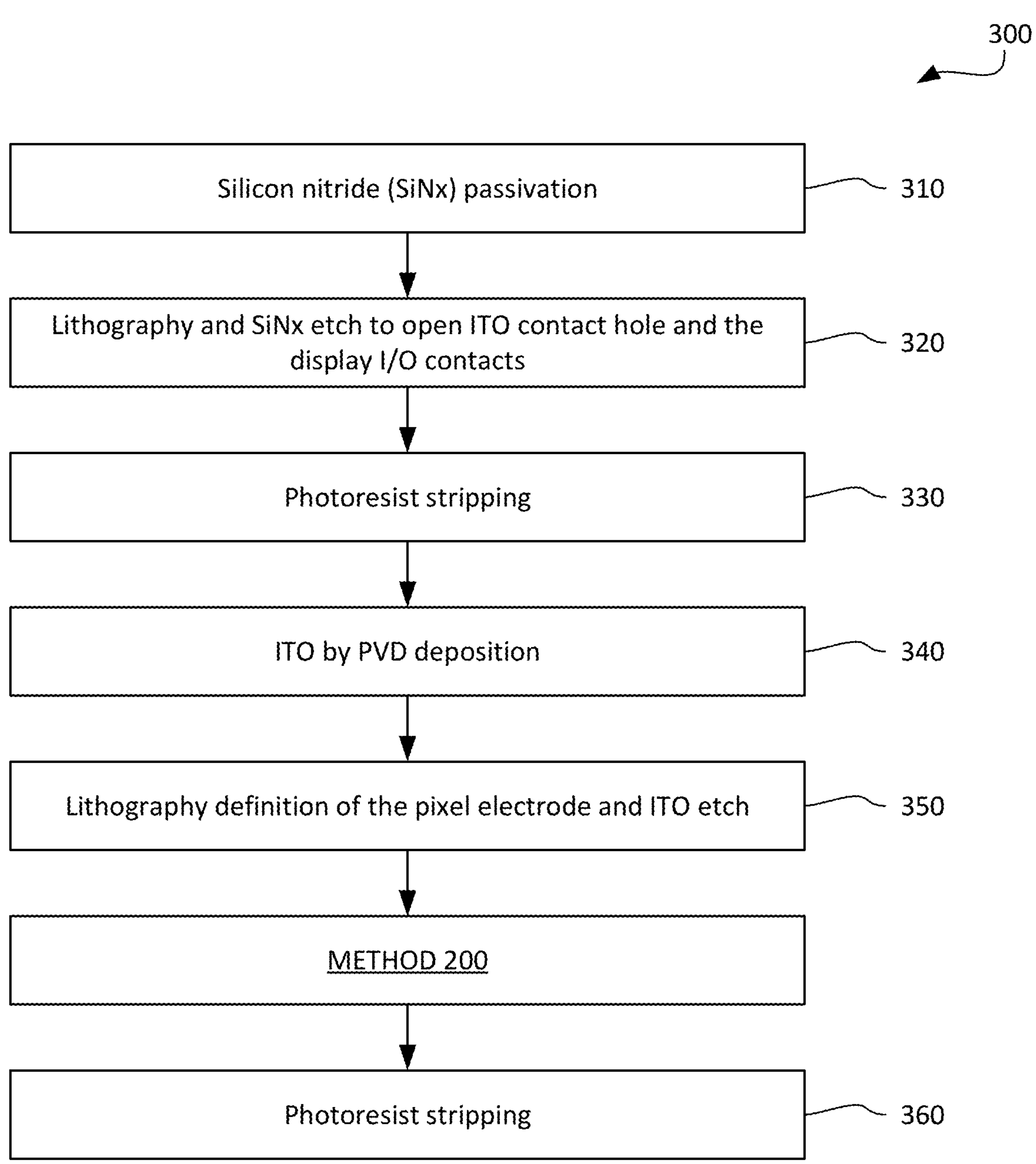
FIG. 7B is a flow chart of a process of manufacturing the pixel electrodes on the substrate, where the method of FIG. 5 is performed during the process.

In some embodiments, the buffer material may comprise a photoresist coating on the substrate. In other words, the method 200 may be performed before step 360 of photoresist stripping in the process 300, as shown in FIG. 7B. The photoresist coating may have a thickness of 2 μm to 5 μm, and may have a dielectric constant of about 4. During testing, the mirrored pellicle of the EO modulator may be disposed directly on the photoresist coating, which may protect the ITO electrode surfaces from damage from the EO modulator during testing.

With the method 200, VIOS sensitivity may be increased by decreasing or eliminating the air gap between the substrate and the EO modulator during testing. The addition of a plastic foil on the mirrored pellicle or the reliance on the photoresist coating remaining on the substrate may protect the ITO electrode surfaces during testing, without modifying the PDLC sensor material itself.

The system 100 and method 200 may further improve VIOS sensitivity using a bias voltage compensation (BVC) driving voltage approach. In a standard measurement sequence, there may be N=2n calibration (CAL) frames and M=2 m measurement (MEAS) frames. The CAL frames are taken when bias voltage is modulated with known $\Delta V$ related to the nominal $V_b$. This creates the known relation between the voltage on the modulator and the camera image gray levels. The MEAS frames are taken with additional modulation of pixels voltage on a panel. In the standard sequence, the bias voltage of MEAS frames is modulated with constant value of the nominal $V_b$, and the effective voltage on the modulator is $V_b$ plus voltage on the panel (Pixels Voltage).

Voltage Image noise can be reduced, if the MEAS value for the "Good" pixels is made equal to 0. Defect Signal per Standard Deviation (DSNR) value will be increased accordingly. In the BVC measurement sequence, the bias voltage for MEAS frames is modulated relative to the nominal $V_b$. The amplitude of the modulation is equal to the Pixels Voltage value. The effective voltage on the modulator for "Good" pixels keeps the same (nominal $V_b$) for all MEAS frames. The image gray level intensity of all MEAS frames will be identical for "Good" pixels. With the BVC approach, the effective voltage on the modulator is kept at the nominal bias voltage for all MEAS frames. Accordingly, the VIOS sensitivity is maximal for all MEAS frames.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:

a support for a substrate;

an electro-optic modulator separated from the substrate by a buffer material, wherein there is no air gap between the electro-optic modulator and the substrate, the electro-optic modulator comprising:

a mirrored pellicle disposed proximate to the support, wherein the buffer material is disposed between the mirrored pellicle and the substrate;

a transparent electrode distal from the support; and a polymer dispersed liquid crystal (PDLC) sensor material disposed between the transparent electrode and the mirrored pellicle;

a light source configured to illuminate the PDLC sensor material during application of a voltage to the transparent electrode;

a detector configured to detect intensity of light reflected by the mirrored pellicle; and a processor configured to determine whether a pixel electrode on the substrate is a defective pixel electrode or a functioning pixel electrode based on the intensity of the light reflected by the mirrored pellicle.

2. The system of claim 1, wherein the buffer material comprises a plastic foil disposed on the mirrored pellicle.

3. The system of claim 2, wherein the plastic foil has a thickness of 1 μm to 20 μm.

4. The system of claim 2, wherein the plastic foil comprises $BaTiO_3$/poly(methyl methacrylate) or poly(methyl methacrylate)+$LiClO_4$+(polyethylene glycol).

5. The system of claim 2, wherein the light source is configured to illuminate the PDLC sensor material during application of the voltage to the transparent electrode after a photoresist coating is stripped from the substrate.

6. The system of claim 1, wherein the buffer material comprises a photoresist coating on the substrate.

7. The system of claim 6, wherein the photoresist coating has a thickness of 2 μm to 5 μm.

8. The system of claim 1, wherein the substrate comprises a glass plate including a pixel array, and each pixel of the pixel array comprises a thin film transistor circuit and an electrode.

9. The system of claim 1, wherein the processor is further configured to:

compare an intensity of the light corresponding to each pixel electrode to a preset calibration range;

wherein the pixel electrode is determined to be a defective pixel when a gray level intensity is outside of the preset calibration range, and the pixel electrode is determined to be a functioning pixel when the gray level intensity is within the preset calibration range.

* * * * *